United States Patent [19]

Gilker

[11] 4,393,431

[45] Jul. 12, 1983

[54] OVERCURRENT RELAY CIRCUIT

[75] Inventor: Clyde Gilker, So. Milwaukee, Wis.

[73] Assignee: McGraw-Edison Company, Rolling Meadows, Ill.

[21] Appl. No.: 142,880

[22] Filed: Apr. 23, 1980

[51] Int. Cl.³ ............................................... H02H 9/02
[52] U.S. Cl. ....................................... 361/97; 361/93
[58] Field of Search ..................... 361/93, 94, 96, 97; 363/59; 307/490, 320

[56] References Cited

U.S. PATENT DOCUMENTS

| | | |
|---|---|---|
| 3,160,854 | 8/1963 | Riebs .................................. 361/94 X |
| 3,167,686 | 1/1965 | Riebs . |
| 3,295,017 | 12/1966 | Riebs et al. ........................ 361/94 X |
| 3,302,070 | 1/1967 | Burley . |
| 3,398,328 | 8/1968 | Piekarski . |
| 3,465,208 | 9/1969 | Patrickson et al. . |
| 3,489,955 | 1/1970 | Freeborn . |
| 3,496,417 | 2/1970 | Tenenbaum . |
| 3,539,838 | 11/1970 | Moses . |
| 3,600,610 | 8/1971 | Kelsch et al. . |
| 3,624,425 | 11/1971 | Blumenstein . |
| 3,671,814 | 6/1972 | Dick . |
| 3,697,813 | 10/1972 | Fox . |
| 3,702,425 | 11/1972 | Hoffmann et al. . |
| 3,723,818 | 3/1973 | Zocholl ................................ 361/97 |
| 3,809,962 | 5/1974 | Brown et al. . |
| 3,836,790 | 9/1974 | Becker . |
| 3,836,821 | 9/1974 | Wahlgren et al. . |
| 3,839,668 | 10/1974 | Black . |
| 4,131,929 | 12/1978 | Moran ................................. 361/93 |

Primary Examiner—Reinhard J. Eisenzopf
Attorney, Agent, or Firm—Jon Carl Gealow; Hugh M. Gilroy

[57] ABSTRACT

An overcurrent relay circuit has a power supply developed from a test signal representative of the current in the line being monitored. The power supply is a Zener diode and capacitor arrangement connected in series with the load or test resistor. A variable time-current characteristic circuit (or timing plug) is based upon a variable effective capacitance circuit in which the timing capacitor and resistor currents are isolated from, but dependent upon, one another.

13 Claims, 3 Drawing Figures

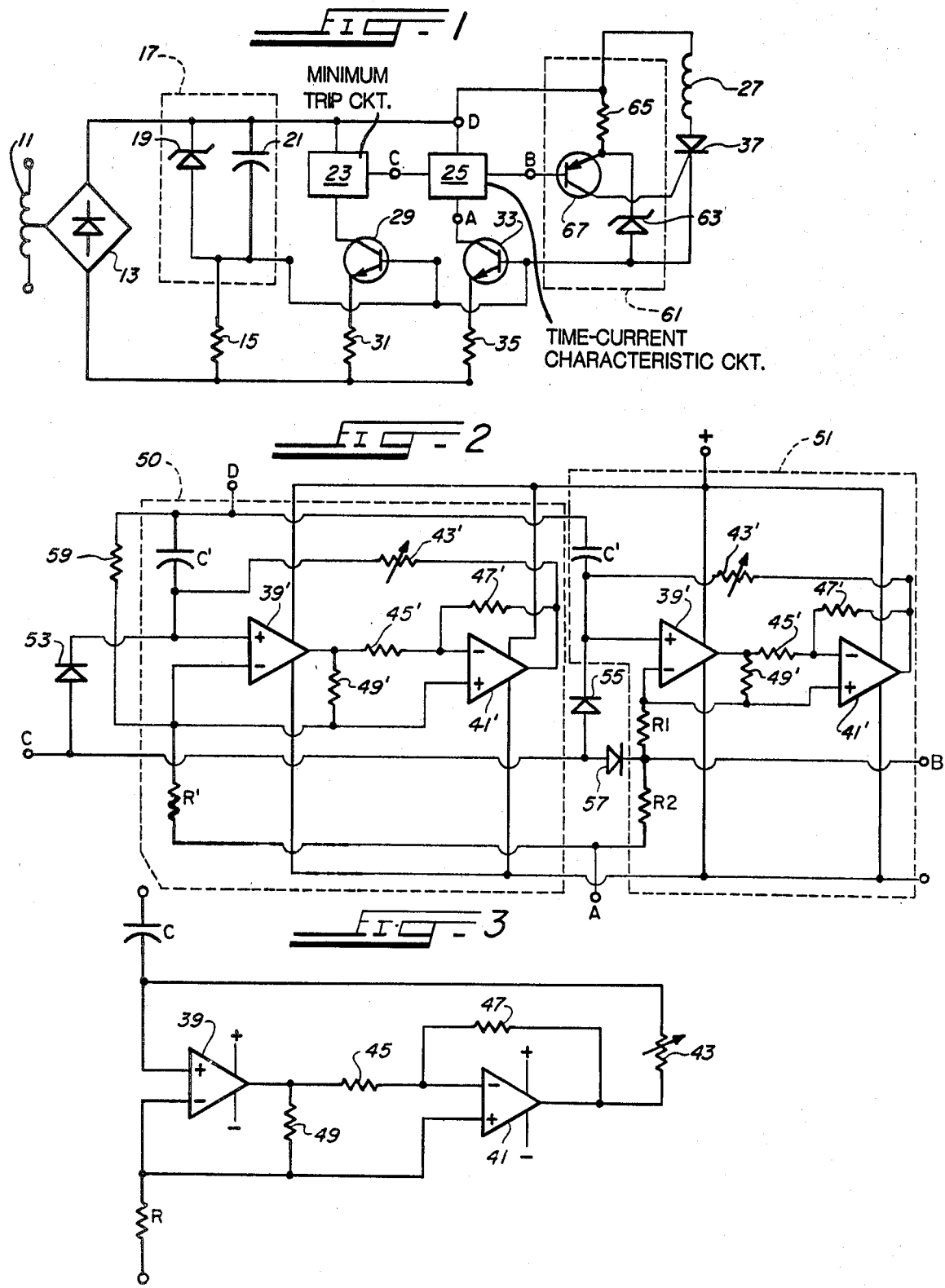

OVERCURRENT RELAY CIRCUIT

BACKGROUND OF THE INVENTION

The present invention relates generally to overcurrent relay circuits, and more specifically, the present invention relates to overcurrent relay circuits having an internally produced power supply and a variable time-current characteristic circuit. In an overcurrent relay, a relay trip coil is energized a certain time after the current in the line being monitored exceeded a minimum trip level. The period between the time at which the minimum trip level is exceeded and the time at the trip coil is energized will depend upon the amount by which the trip level is exceeded. Energization of the trip coil is achieved by an appropriate power supply.

In prior art devices, there have been two basic approaches to providing the power supply for energizing the relay trip coil. One of these approaches utilizes the signal developed in the overcurrent relay circuit by placing a breakdown device, such as a Zener diode, and an associated series resistor in parallel with the test or load resistor. With such an arrangement, the test resistor must be relatively small, so that as much of the test current as possible will flow through the test resistor. However, the use of such a relatively small test resistor, plus the fact that a certain amount of current is still going to be bypassed through the Zener diode circuit, results in an inevitable inaccuracy or distortion in the correspondence between the voltage developed across the test resistor and the current in the line being monitored. Also, there is an undesired delay in operation arising from the necessity of developing an IR drop across the test resistor of sufficient magnitude to break down the Zener diode.

Another prior art approach, which avoids the problem of inaccuracy, is the utilization of a separate battery as the power supply for the relay trip coil. This approach, of course, has an economic disadvantage associated with the cost and maintenance of a separate battery.

Another problem associated with many prior art overcurrent relay circuits is that a single fixed time-current characteristic (TCC) circuit is used. Therefore, when it is desired to increase or decrease the time span between the current in the line being monitored reaching the minimum trip level and energization of the relay trip coil, the time amount characteristic circuit must be reconfigured. Therefore, line current conditions can result in numerous unnecessary line openings, or, conversely, an overload condition may exist for a longer time than desired prior to opening of the line. Since variable capacitors, fundamental elements of solid state analog overcurrent relays of the size that would be appropriate, are either not commercially available, or those available are cost prohibitive, some other approach is required to adjust the time-current characteristic.

There have been attempts to modify the time-current characteristics of overcurrent relays, such as the system illustrated in U.S. Pat. No. 3,167,636, assigned to the assignee of the present invention. However, systems of the type shown therein, involve extra switching which further complicates the system. Also, in some cases, variable value charging elements have been suggested. However, as indicated above, this type of element is impractical and subject to difficulties arising from insufficient accuracy over the large range of values needed.

SUMMARY OF THE INVENTION

With the present invention, it is possible to obtain a power supply for an overcurrent relay circuit without the use and concomitant costs of a separate battery, while at the same time avoiding the inaccuracies of prior art devices which use the signal developed in the overcurrent relay circuit to produce an internal power supply. This is achieved by locating the power supply forming circuit in series with the test or load resistor, so that all the current developed in the overcurrent relay circuit passes through the test resistor. As a result, the voltage produced across the test resistor remains an accurate representation of the current in the line being monitored. In the preferrred embodiment of the invention disclosed herein, the power supply circuit includes a parallel combination of a Zener diode and a capacitor.

A relay trip coil, a time-current characteristic circuit and a minimum trip circuit are all energized by the power supply circuit. The minimum trip circuit is essentially a level detector, which produces an output when the current in the line being monitored exceeds a predetermined level. The current through the minimum trip circuit is controlled by the voltage produced across the test resistor (and hence, the magnitude of the current in the line being monitored), by coupling the voltage across the test resistor to the base electrode of a transducer via a relatively large resistor. A step voltage, is produced by the trip circuit when the predetermined level is exceeded.

Application of the output of the minimum trip circuit to the time-current characteristic circuit provides an activating signal for the time-current characteristic circuit and will result in energization of the relay trip coil, after a time internally determined by the time-current characteristic circuit. The length of the internal time depends upon the voltage developed across the test resistor. This voltage is applied to the base of another transistor connected in series with the resistor to adjust the current flow through the time-current characteristic circuit. After the time delay determined by the time-current characteristic circuit, the relay trip coil may be energized using a controlled switching device, such as a silicon controlled rectifier (SCR).

In order to permit selection of various time-current characteristics, a variable time-current characteristic circuit (or variable timing plug) is utilized. This variable timing plug employs a control circuit having a pair of variable capacitance multiplier circuits which comprise operational amplifiers connected in an inverting feedback configuration. When so configured, the effective capacitance is changed by adjustment of a variable resistor which alters the current in the charging capacitor of the RC timing circuit. This in turn changes the charging rate while the current through the timing resistor corresponds to that which would result if it were connected in a simple RC network. At the same time, the charging capacitor and the timing resistor maintain their fixed values, while demonstrating an apparent variable capacitance. While both the variable capacitance multiplier and the variable timing plug described have particular advantage when used with the overcurrent relay circuit of the present invention, it will be apparent to those skilled in the art that they may also have applications in many other types of circuits.

These and other objects, advantages and features of this invention will hereinafter appear, for purposes of illustration, but not of limitation, in an exemplary embodiment of the subject invention which is shown in the appended drawing.

BRIEF DESCRIPTION OF THE DRAWING

FIG. 1 is a schematic circuit diagram of an overcurrent relay circuit constructed in accordance with the present invention.

FIG. 2 is a schematic circuit diagram of a variable timing plug for use in connection with the circuit of FIG. 1.

FIG. 3 is a schematic circuit diagram of a basic variable capacitance multiplier utilized in the variable timing plug of FIG. 2.

DETAILED DESCRIPTION OF THE PREFERRED EMBODIMENT

With reference to FIG. 1, an overcurrent relay circuit constructed in accordance with the present invention is disclosed. A current trnsformer 11 is schematically illustrated by the coil shown. This current transformer has a primary winding in the line being monitored, so that a representation of the current in that line appears in the secondary of the current transformer winding in the overcurrent relay circuit.

The AC current in the secondary winding of the current transformer is rectified by an appropriate rectifier 13. Rectifier 13 may be any appropriate type of rectifying apparatus, but in this preferred embodiment, a full wave diode bridge rectifier has been employed.

For purposes of establishing a voltage that is representative of the magnitude of the current in the line being monitored, a test or load resistor 15 is employed. Test resistor 15 is connected in series with a power supply circuit 14, which includes a Zener diode 19 and a capacitor 21. The output of the rectifier 13 charges capacitor 21 through test resistor 15 to the breakdown voltage of the Zener diode 19, after which essentially the full current output of rectifier 13 passes through Zener diode 19 and the test resistor 15. In this fashion, the power supply circuit 17 is a source of desired electrical power for other components of the circuit, while essentially all of the current from the current transformer 11 passes through the test resistor 15, so that the voltage developed across resistor 15 is an accurate representation of the magnitude of the current in the line monitored.

A minimum trip circuit 23 and a time-current characteristic circuit 25 are employed to govern energization of a relay trip coil 27.

The emitter-collector circuit of a transistor 29 is connected from the minimum trip circuit 23 to a current limiting resistor 31. Resistor 31 is very large in comparison to resistor 15. The base of transistor 29 is connected to the test resistor 15, so that the voltage produced across test resistor 15 is applied across the series combination of the base-emitter circuit of transistor 29 and resistor 31.

In a similar fashion, the emitter-collector circuit of a transistor 33 is connected from the time-current characteristic circuit 25 to a limiting resistor 35, which is also very large in comparison to test resistor 15. Again, the base of transistor 33 is connected so that the voltage produced across test resistor 15 appears across the series combination of the base-emitter circuit of transistor 33 and resistor 35.

As a result of the test resistor voltage appearing on the base-emitter of transistor 29, and across resistor 31, the current flow through the minimum trip circuit 23 will depend upon the magnitude of the current in the line being monitored. When the magnitude of this current exceeds a predeterined level, the minimum trip circuit will produce an output which is conveyed to the time-current characteristic circuit 25. In essence, the minimum trip circuit is a level detector that produces a negative-going step output only when the voltage across test resistor 15, and hence the magnitude of the current in the line being monitored, exceeds a predetermined level.

Upon receipt of an output signal from minimum trip circuit 23, the time-current characteristic circuit 25 will produce energization of relay trip coil 27, after a desired time delay. This time delay depends upon the amount that the voltage produced across test resistor 15, and hence the magnitude of the current in the line being monitored, exceeds the predetermined level. The effect of the magnitude of the amount by which the minimum trip level is exceeded results from the control of the current through the time-current characteristic circuit 25 by the transistor 33.

After the desired time duration has elapsed subsequent to the production of an output signal by the minimum trip circuit 23, the time-current characteristic circuit 25 causes energization of the relay trip coil 27. Control of the energization of trip coil 27 is achieved through a suitable switching device, such as a transistor 67 and a silicon controlled rectifier (SCR) 37.

With this arrangement, the power supply for the minimum trip and time-current characteristic circuits 23 and 25, as well as the relay trip coil 27, is provided by the power supply circuit 17. Thus, energizing power is produced from the input to the overcurrent relay circuit, without the necessity of a separate power source. In addition, this arrangement is greatly preferable to prior art type incorporated power supplies, in that the power supply circuit 17 is connected in series with the test resistor 15, so that virtually all of the current inserted into the overcurrent relay circuit from the current transformer 11 is passed through test resistor 15. The only current not passed through test resistor 15 is the relatively very small current that passes through the base-emitter circuits of transistors 29 and 33 and the resistors 31 and 35. The relatively very large size of resistors 31 and 35 limit this current to a negligible value.

With reference to FIG. 2, a variable timing plug is illustrated by means of which the time-current characteristic response of the time-current characteristic circuit 25 may be varied. While this variable timing plug may be utilized in other types of applications, it is disclosed herein in the form of the time-current characteristic circuit 25, insertable into FIG. 1 as illustrated by the identical terminals A, B, C and D in FIGS. 1 and 2.

Before completing the description of the variable timing plug of FIG. 2, it is desirable to refer to the individual variable capacitance multiplier circuit illustrated in FIG. 3. In this circuit, a pair of operational amplifiers 39 and 41 are utilized. For a detailed description of operation, reference may be made to the 1970 publication "Linear Integrated Circuits" of RCA Corporation, Technical Series IC-42, p. 128 et seq. The DC bias and the inverting and noninverting inputs of operational amplifiers 39 and 41 are established as illustrated. A fixed value timing resistor R is connected to the inverting input of operational amplifier 41. A fixed value timing capacitor C is connected to the noninverting input of operational amplifier 39 and to the output of operational amplifier 41 through a variable resistance 43. The output of operational amplifier 39 is fed to the inverting input of operational amplifier 41 through coupling resistor 45, while the output of operational amplifier 41 is fed back to the same input through a resistor 47. By selecting resistors 45 and 47 to have the same magnitude, operational amplifier 41 exhibits negative unitary gain. The output of operational amplifier 39 is also fed back to its own inverting input, as well as to the noninverting input of operational amplifier 41, both through a resistor 49.

As an example of an overcurrent relay circuit that has successfully employed the invention disclosed herein, the following illustrative component values may be employed:

Capacitor C: approx. 1 micorfarad
Resistor R: approx. 20 K ohms
Resistor 43: 100 ohms to 100 K ohms
Resistor 45: 100 K ohms
Resistor 47: 100 K ohms
Resistor 49: 1 K ohms Prior to operation, the potential on both plates of capacitor C is equal and near the positive bus voltage. When operation is initiated, current flows out of the circuit through resistor R and tends to lower the inverting input of operational amplifier 39 by a small amount. This causes the output of operational amplifier 39 to go slightly positive with respect to the noninverting input, and the outgoing current to resistor R then flows through resistor 49 from the output of operational amplifier 39. Also, the positive output of operational amplifier 39 is applied to the inverting input of operational amplifier 41 through resistor 45, thus causing the output of operational amplifier 41 to go negative by an amount equal to the positive output of operational amplifier 39. The negative output of operational amplifier 41 is then supplied to the timing capacitor C through the variable resistor 43.

As capacitor C starts to charge through resistor 43, its charge level is applied to the noninverting input of operational amplifier 39. This lowering of the voltage of the noninverting input of operational amplifier 39 requires the inverting input to go to a lower voltage to continue to get a positive output from operational amplifier 39. Since the inverting input of operational amplifier 39 is at a lower level, with the passage of time less current can flow through the timing resistor R and the rate change of the voltage on timing capacitor C becomes less.

Further, the voltage applied to the inverting input of operational amplifier 39 is also applied to the noninverting input of operational amplifier 41. This keeps the input difference between the inverting input and the noninverting input correctly proportional to control the input current.

As the current, which drains from the circuit through the timing resistor R is supplied by operational amplifier 39, and the current that charges the capacitor C comes from operational amplifier 41, the charging current for timing capacitor C and the current through timing resistor R are not the same current. Nevertheless, these two separate currents are directly related, with the ratio of the charging current from the capacitor C to the current through the resistor R being controlled by the variable resistor 43. Therefore, the fixed capacitor C appears to be a variable capacitor as a result of the control of the resistor 43 on the charging current from the capacitor C.

In order to achieve the variable timing plug of FIG. 2, two of the variable capacitance multiplier circuits of FIG. 3 are employed. These two variable capacitance multiplier circuits are identified by the numerals 50 and 51. As may be seen, the output of the minimum trip circuit 23 on terminal C is conveyed to the noninverting input of the operational amplifier 39' of the variable capacitance multiplier circuits 50 and 51 through diodes 53 and 55, respectively. Also, this signal is conveyed to the midpoint of the timing resistor for the variable capacitance multiplier circuit 51, which has been divided into two segments $R_1$ and $R_2$, through a diode 57. In addition, the timing resistor R' of variable capacitance multiplier circuit 50 is connected to the power supply at D through a coupling resistor 59.

In order to control the desired gating of SCR 37, a control circuit 61 is included, as illustrated in FIG. 1. Control circuit 61 includes a Zener diode 63 in series with a resistor 65 to approximately equally divide the voltage of power supply 17. The juncture of Zener 63 and resistor 65 is connected to the emitter of a transistor 67, while terminal B is connected to the base of transistor 67. Prior to operation of minimum trip circuit 23, diode 57 is forwarded biased and hence the emitter base junction of transistor 67 is back biased. Upon operation of minimum trip circuit 23, diode 57 is back biased by the negative-going step voltage on terminal C. When the time current characteristic circuit 25 lowers the voltage at midpoint of resistors $R_1$ and $R_2$ sufficiently, the emitter-base junction becomes forward biased and current flows to the gate of SCR 37 to trigger the SCR and initiate energization of relay coil 27.

With this arrangement, an overcurrent relay circuit is provided having a time-current characteristic circuit 25 in which a desired time-current characteristic can be selected by appropriate setting of the variable resistors 43' in the variable capacitance multiplier circuits 50 and 51. Therefore, tripping of the overcurrent relay may be accurately adjusted for a desired time after line current has exceeded a predetermined level.

It should be understood that various modifications, changes and variations may be made in the arrangement operation and details of construction of the elements disclosed herein without departing from the spirit and scope of this invention.

I claim:
1. An overcurrent relay circuit comprising:
 a relay trip coil to be energized when the AC current in a line being monitored exceeds a predetermined magnitude;
 a current transformer to produce a signal proportional to the current in the line being monitored;
 a rectifier to produce a DC signal from the output of said current transformer;
 a test resistor across which a voltage indicative of the magnitude of the current in the line being monitored is developed by the output of said rectifier;
 a minimum trip circuit responsive to the voltage developed across said test resistor to produce an output signal representative of the magnitude of the current in the line being monitored, after the magnitude of such current exceeds a predetermined level;
 a time-current characteristic circuit responsive to the output signal of said minimum trip circuit to initiate energization of said relay trip coil with a time delay dependent upon the extent to which the magnitude of the current in the line being monitored exceeds the predetermined level including, a first RC timing circuit having a first timing capacitor and a first timing resistor with fixed capacitance and resistance values respectively, a first pair of operational amplifiers connected in an inverse feedback configuration between said first timing capacitor and said first timing resistor, and a first variable resistor connected to permit adjustment of the effective capacitance of said first timing capacitor upon changing the resistance of said first variable resistor; and a power supply circuit in series with said test resistor to provide energizing power for said relay trip coil, said minimum trip circuit and said time-current characteristic circuit from the output of said rectifier.

2. An overcurrent relay circuit as claimed in claim 1 wherein said time-current characteristic circuit further comprises:

a second RC timing circuit having a second timing capacitor and a second timing resistor with fixed capacitance and resistance values, respectively, one end of said second timing capacitor connected to a corresponding end of said first timing capacitor and one end of said second timing resistor connected to a corresponding end of said first timing resistor;

a second pair of operational amplifiers connected in an inverse feedback configuration between said second timing capacitor and said second timing resistor; and a second variable resistor connected to permit adjustment of the effective capacitance of said second timing capacitor upon changing the resistance of said second variable resistor.

3. An overcurrent relay circuit as claimed in claim 2 wherein said second timing resistor is divided into two segments, the junction of said segments being connected to the output of said minimum trip circuit.

4. An overcurrent relay circuit as claimed in claim 3 and further comprising:

a first diode connected from the output of said minimum trip circuit to the side of said first timing capacitor not connected to said second timing capacitor;

a second diode connected from the output of said minimum trip circuit to the side of said second timing capacitor not connected to said first timing capacitor; and a third diode connected from the output of said minimum trip circuit to the junction of said second timing resistor segments.

5. An overcurrent relay circuit as claimed in claim 2 wherein:

each of said pairs of operational amplifiers comprises first and second operational amplifiers with the output of said first operational amplifier connected to the inverting input of said second operational amplifier; and each of said variable resistors is connected from the output of the associated second operational amplifier to the noninverting input of the corresponding first operational amplifier.

6. An overcurrent relay circuit comprising:

a relay trip coil to be energized when the AC current in a line being monitored exceeds a predetermined magnitude;

a current transformer to produce a signal proportional to the current in the line being monitored;

a rectifier to produce a DC signal from the output of said current transformer;

a test rectifier across which a voltage indicative of the magnitude of the current in the line being monitored is developed by the output of said rectifier;

a power supply circuit having a Zener diode and a capacitor connected in parallel therewith, said power supply circuit being connected in series with said test resistor;

a minimum trip circuit responsive to the voltage developed across said test resistor to produce an output signal representative of the magnitude of the current in the line being monitored, after the magnitude of such current exceeds a predetermined level;

a time-current characteristic circuit including two variable capacitance multiplier circuits, each of said multiplier circuits comprising first and second operational amplifiers;

a first coupling resistor connected from the output of the first operational amplifier in each multiplier circuit to the inverting input of the associated second operational amplifier;

a first feedback resistor connected from the output of each of said second operational amplifiers to the inverting input thereof, said first feedback resistor being approximately the same resistance as said first coupling resistor;

a second feedback resistor connected from the output of each of said first operational amplifiers to the inverting input thereof, the resistance of said second feedback resistor being substantially lower than that of said first feedback resistor and said first coupling resistor, said second feedback resistor also connecting the output of said first operational amplifier to the noninverting input of said second operational amplifier;

first and second fixed value timing capacitors, one side of said timing capacitors being connected in common, with the other side of each being connected to the noninverting input of an associated first operational amplifier, the common side of said timing capacitors connected to said power supply circuit;

first and second fixed value timing resistors, one side of said timing resistors being connected in common, with the other side of each being connected to the inverting input of the associated first operational amplifier and the noninverting input of the associated second operational amplifier, said second timing resistor located in the second multiplier circuit being divided into two circuits;

a second coupling resistor connected from said power supply circuit to the side of said first timing resistor connected to the inverting input of its associated first operational amplifier in the first multiplier circuit;

first and second diodes, each of said diodes connected from the output of said minimum trip circuit to the noninverting input of an associated first operational amplifier;

a third diode connected from the output of said minimum trip circuit to the junction of said segments of said second timing resistor;

a first switching device to determine energization of said relay trip coil; and a control circuit connected to the output of said time-current characteristic circuit to actuate said switching device.

7. An overcurrent relay circuit as claimed in claim 6 wherein:

a second switching device and a first limiting resistor of relatively larger resistance than said test resistor are connected in series with said minimum trip circuit; and a third switching device and a second limiting resistor of relatively larger resistance than said test resistor are connected in series with said time-current characteristic circuit.

8. An overcurrent relay circuit as claimed in claim 7 wherein:

said first switching device is a silicon controlled rectifier; and said second and third switching devices are transistors.

9. An overcurrent relay circuit as claimed in claim 6 wherein said control circuit comprises:

a transistor having the output of said time-current characteristic circuit connected to the base thereof and the collector thereof connected to control said first switching device; and a Zener diode and a resistor in series across said power supply circuit, the junction of said Zener diode and resistor being connected to the emitter of said transistor.

10. A timing plug comprising:

two variable capacitance multiplier circuits, each of said multiplier circuits comprising first and second operational amplifiers;

a first coupling resistor connected from the output of the first operational amplifier in each multiplier circuit to the inverting input of the associated second operational amplifier;

a first feedback resistor connected from the output of each of said second operational amplifiers to the inverting input thereof, said first feedback resistor being approximately the same resistance as said first coupling resistor;

a second feedback resistor connected from the output of each of said first operational amplifiers to the inverting input thereof, said second feedback resistor being of considerably lesser resistance than said first feedback resistor, said second feedback resittor also connecting the output of said first operational amplifier to the noninverting input of said second operational amplifier;

first and second fixed value timing capacitors, one side of said timing capacitors being connected in common, with the other side of each being connected to the noninverting input of an associated first operational amplifier, the common sides of said timing capacitors being connected to a power supply;

first and second fixed value timing resistors, one side of said timing resistors being connected in common, with the other side of each being connected to the inverting input of the associated first operational amplifier and the noninverting input of the associated second operational amplifier, said second resistor located in the second multiplier circuit being divided into two segments;

a second coupling resistor connected from the power supply to the side of said first timing resistor connected to the inverting input of its associated first operational amplifier in the first multiplier circuit;

first and second diodes, each of said diodes connected from an activating source to the noninverting input of an associated first operational amplifier; and a third diode connected from the activating source to the junction of said segments of said second timing resistor.

11. A variable capacitance multiplier circuit comprising:

first and second operational amplifiers, each of said operational amplifiers having an inverting and a noninverting input;

bias means for said operational amplifiers;

a fixed value timing capacitor having one side thereof connected to the noninverting input of said first operational amplifier;

a fixed value timing resistor having one side thereof connected to the inverting input of said first operational amplifier and to the noninverting input of said second operational amplifier;

a coupling resistor connected from the output of said first operational amplifier to the inverting input of said second operational amplifier;

a first feedback resistor connected from the output of said first operational amplifier to the inverting input thereof and to the noninverting input of said second operational amplifier;

a second feedback resistor connected from the output of said second operational amplifier to the inverting input thereof; and a third feedback resistor connected from the output of said second operational amplifier to the noninverting input of said first operational amplifier, at least one of said coupling resistor and said second and third feedback resistors being variable in order to adjust the effective capacitance of said timing capacitor without affecting the current through said timing resistor.

12. A variable capacitance multiplier circuit as claimed in claim 11 wherein said third feedback resistor is variable.

13. A variable capacitance multiplier circuit as claimed in claim 12 wherein said coupling resistor and said second feedback resistor are substantially equal in resistance.

* * * * *